United States Patent [19]

Bachmann et al.

[11] Patent Number: 5,102,689

[45] Date of Patent: Apr. 7, 1992

[54] METHOD OF DEPOSITING MICROCRYSTALLINE SOLID PARTICLES FROM THE GAS PHASE BY MEANS OF CHEMICAL VAPOR DEPOSITION

[75] Inventors: Peter K. Bachmann, Aachen; Hans Lydtin, Stolberg, both of Fed. Rep. of Germany; Jacques Warnier, Eijsden, Netherlands

[73] Assignee: U.S. Philips Corporation, New York, N.Y.

[21] Appl. No.: 570,238

[22] Filed: Aug. 17, 1990

[30] Foreign Application Priority Data

Aug. 17, 1989 [DE] Fed. Rep. of Germany ....... 3927133

[51] Int. Cl.⁵ .................. B05D 3/02; B05D 3/06; C23C 16/00
[52] U.S. Cl. ..................... 427/45.1; 427/46; 427/248.1; 427/249; 427/255.1; 427/255.2; 427/38; 427/314
[58] Field of Search ............ 427/45.1, 314, 248.1, 427/46, 255, 255.1, 255.2, 38, 249, 250

[56] References Cited

U.S. PATENT DOCUMENTS 4,647,512 3/1987 Venkataramanan et al. ....... 428/688

OTHER PUBLICATIONS

Matsumoto et al., "Synthesis of diamond films in a rf induction thermal plasma", Appl. Phys. Lett. 51(10) Sep. 1987 pp. 737-739.

Primary Examiner—Shrive Beck
Assistant Examiner—Roy V. King
Attorney, Agent, or Firm—Norman N. Spain

[57] ABSTRACT

Method of depositing microcrystalline solid bodies from the gas phase by means of Chemical Vapor Deposition (CVD) in which the solid particles are deposited on a substrate heated to a temperature ranging between 450° and 1200° C. at a pressure ranging between $10^{-5}$ and 1 bar and at a directed gas flow, in which method the reactant gas is passed through a porous intermediate body having a thickness of between 2 and 30 mm of a material suitable for use at temperatures up to 2500° C., which intermediate body is present in the zone having the maximum energy content within the reactor, while the reactant gas is excited in said intermediate body, whereafter the solid particles are deposited on the substrate.

14 Claims, 1 Drawing Sheet

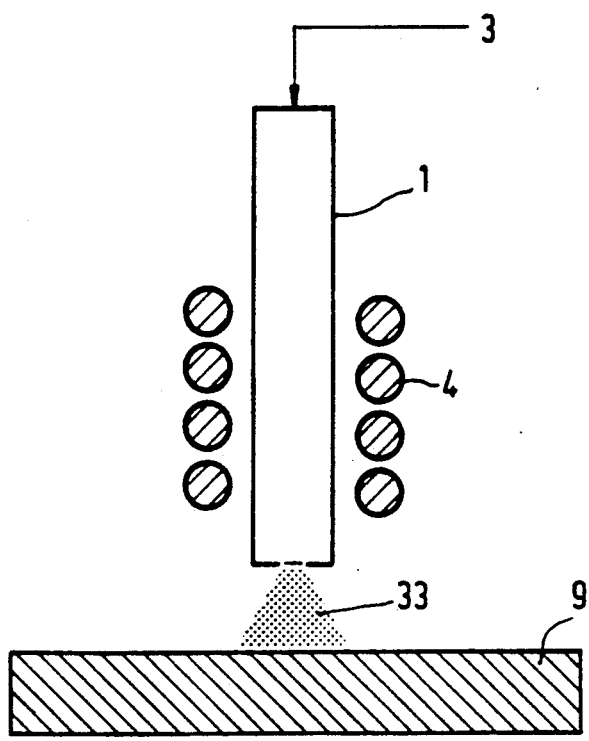
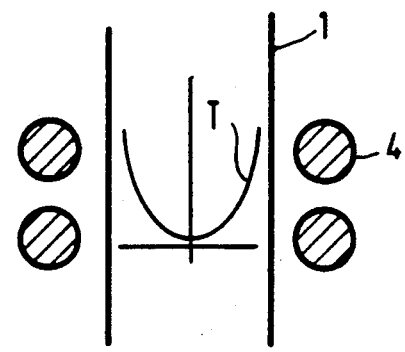
FIG.1a PRIOR ART
FIG.1b PRIOR ART
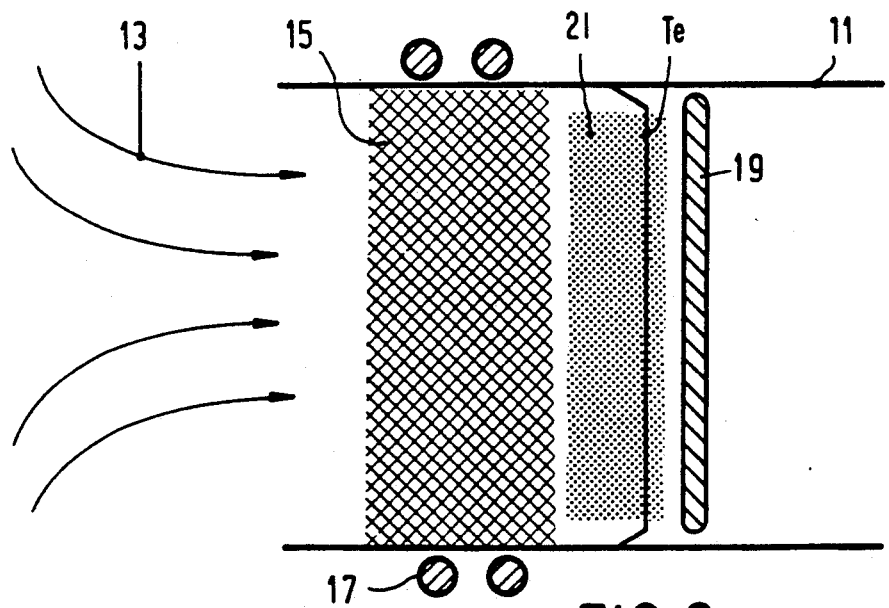
FIG.2

METHOD OF DEPOSITING MICROCRYSTALLINE SOLID PARTICLES FROM THE GAS PHASE BY MEANS OF CHEMICAL VAPOR DEPOSITION

BACKGROUND OF THE INVENTION

The invention relates to a method of depositing microcrystalline solid particles from the gas phase by means of Chemical Vapour Deposition (CVD), in which the solid particles are deposited on a substrate heated to a temperature ranging between 450° and 1200° C. at a pressure ranging between $10^{-5}$ and 1 bar and in a directed gas flow.

The deposition of microcrystalline solid bodies from the gas phase by means of Chemical Vapor Deposition (CVD) is widely used for manufacturing self-supporting moulded bodies or for forming layers on substrates of different types.

A general characteristic feature of a CVD process is that a mixture of gases interacts at a relatively high temperature interacts while decomposing at least one gas in the gas mixture and depositing a reaction product in a fixed phase on a substrate surface. The conventional CVD process requires high temperatures, reactive gases and a device which is suitable for performing such a method. Typical process parameters are temperatures ranging between 450° and 2500° C., pressures ranging between $10^{-5}$ and 1 bar and a reactant gas mixture comprising at least one reactive gas and additional gases such as inert, oxidizing or reducing gases.

Accordingly, the reaction products (solid particles) are obtained by
pyrolysis (for example: $CH_3SiCl_3 \rightarrow SiC + 3HCl$) or
reduction (for example: $WF_6 + 3H_2 \rightarrow W + 6HF$) or
oxidation (for example: $SiH_4 + O_2 \rightarrow SiO_2 + 2H_2$) or
co-reduction (for example: $TiCl_4 + 2BCl_3 + 5H_2 \rightarrow TiB_2 + 10\ HCl$).

The reactant gas mixture is activated within the reactor in an excitation zone (gas phase range with maximum energy content), which can be generated through an inductively heated wire or a flame via a plasma which is obtained by coupling in microwave energy or high-frequency energy or energy from an electric d.c. field. In the excitation zone the gas phase reactions are stimulated and the reaction products are subsequently deposited on the substrate which is preferably positioned at a distance from the excitation zone on a conventional temperature-controlled substrate holder. The residual gases are exhausted from the reactor by means of a vacuum pump.

Energetic excitation via resistance heating of a gas phase for a CVD process for depositing diamond in a tubular reactor is known from the publication by W. Yarbrough and R. Roy in Extended Abstracts of the Spring Meeting Session of the Materials Research Society, USA, April 1988, pages 33 etc. This state of the art method is shown diagrammatically in FIGS. 1a and 1b. The reactant gas mixture 3 is introduced into the tubular reactor 1 and brought to the required reaction energy level within an excitation zone (zone having a maximum energy content) which is generated by the resistance heating member 4.

The activated reactant gas mixture 33 exits at the end of the reactor 1 and diamond is deposited on a substrate 9 arranged at a distance from the reactor 1. FIG. 1b diagrammatically shows the excitation zone as a section with its temperature profile T throughout the cross-section of the reactor 1. The drawback of such a process is the inhomogeneity of the excitation throughout the cross-section of the gas phase to be excited. Under circumstances a part of the gases, for example, in the center of the reactor tube may not yet be energetically brought to the reaction level, while other parts, for example, at the reactor wall are already excited to such an extent that the deposition reactions already lead to a homogeneous nucleation of the materials to be deposited in the gas phase instead of to a formation of layers on the substrate. In addition to the formation of particles already in the gas phase there is the further unwanted effect that the layer deposited on the substrate is inhomogeneous as far as composition and layer thickness are concerned.

SUMMARY OF THE INVENTION

It is an object of the invention to improve the method described in the opening paragraph in such a way that the excitation of the reactant gas is optimized within the zone having the maximum energy content.

According to the invention this object is accomplished in that the reactant gas is passed through a porous intermediate body having a thickness of between 2 and 30 mm of a material suitable for use at temperatures up to 2500° C., which body is present in the zone having the maximum energy content within the reactor, while the reactant gas is excited in said intermediate body, whereafter the reactant solid particles are deposited on the substrate.

BRIEF DESCRIPTION OF THE DRAWING

In the drawing

FIG. 1a is a diagrammatic view of the CVD device employed in the W. Tarbrough et al article, FIG. 1b is a diagrammatic view showing of the excitation zone and a temperature profile of the CVD device employed in the W. Tarbrough et al article and FIG. 2 is a diagrammatic view of a CVD device employed in the method of the invention.

DETAILED DESCRIPTION OF THE INVENTION

In accordance with advantageous further embodiments of the method according to the invention, loose powders which are present on a gas-permeable support or powders which are compressed to a moulded body, or porous solid bodies having through-pores with sizes ranging between 1 and 100 μm, formed for example of porous sintered metals, porous ceramic material or porous carbon such as foamed carbon or graphite felt are used as intermediate bodies.

In accordance with advantageous further embodiments of the method according to the invention a CVD process is used in which the energy required for the deposition process is coupled into the intermediate body as microwave energy or as high-frequency energy or by means of a direct current flow through the intermediate body.

The method according to the invention provides the advantage that the excitation of the reactant gas within the zone having a maximum energy content is optimized. The entire reactant gas flow passes the porous intermediate body. The gas molecules are evenly excited throughout the available cross-section of the intermediate body via multiple collision of the molecules of the gas phase to be excited with the pore walls of the intermediate body heated by the energy coupled into the intermediate body. The quality of the resultant deposition is then also homogeneous throughout the cross-section available for excitation. The reaction can then be carried out in such a way that the conditions of excitation required for forming the desired material can be maintained throughout the reactor cross-section.

Overheated peripheral zones or low-energetic core zones of the flow profile are avoided in this manner. The surface with homogeneous deposition substantially corresponds to the cross-sectional area of the porous intermediate body exciting the gas phase.

The invention will be described in greater detail with reference to an embodiment thereof and to FIG. 2 of the drawing.

Referring to FIG. 2, a reactant gas mixture 13 flowing through a porous intermediate body 15 is fed into a reactor 1. The intermediate body 15 is in the zone having a maximum energy content in which the energy required for exciting the 13 is coupled into the reactor 11 and the intermediate body 15 reactant by means of an induction coil 17 arranged outside the reactor 11 in this embodiment. In the intermediate body 15 the gas mixture 13 is energetically raised to the reaction level (activated reactant gas mixture 21) but due to the flow rate the activated reactant gas mixture leaves the intermediate body reactant so rapidly that the reaction products (solid particles) are deposited on a substrate 19 arranged at a distance from the intermediate body 15. The reference Te denotes the temperature profile of the activated process gas mixture 21.

Dependent on the type of deposition process, the substrate may be heated or cooled.

Substantially all materials which can be processed as porous solid bodies or as loose powders and are suitable for process temperatures up to 2500° C. can be used as materials for the porous intermediate body 15. Powders of diamond or graphite, hard materials such as oxides, carbides or nitrides or of metals such as, for example tungsten can be used for this purpose. In addition, intermediate bodies in the form of porous solid bodies having through-pores of a size of between 1 and 100 μm of, and formed for example porous sintered metals such as tungsten, molybdenum or tantalum, porous ceramic materials such as aluminium oxide or silicon nitride or of porous carbon such as foamed carbon or graphite felt can also be used advantageously.

To deposit a polycrystalline diamond layer, a reactant gas mixture 13 comprising 0.5% of methane and 99.5% of hydrogen was introduced into the tubular double-walled water-cooled reactor 11 whose outer wall was surrounded by the induction coil 17. The high-frequency energy supplied by a 13.45 MHz transmitter heats the intermediate body 15 within the reactor 11 to a temperature of approximately 2300° C.

In the relevant example this intermediate body 15 consisted of porous graphite and had a diameter of 2 cm and a thickness of 0.5 cm. The overall flow rate of the reactant gas mixture 13 was 500 sccm, the overall pressure in the reactor 11 was approximately 65 mbar. The reactant gas mixture 13 was evenly heated within the porous intermediate body 15 throughout the cross-section of this body so that the gas phase was a highly excited (activated reactant gas mixture 21) when it from the intermediate body 15 and a homogeneous diamond layer having a diameter of approximately 2 cm was deposited on the surface of the silicon substrate 19 arranged at a distance of approximately 8 mm from the intermediate body 15 and heated to a temperature of 950° C.

We claim:

1. A method of depositing monocrystalline solid particles formed from a reactant gas flow by means of chemical vapor deposition (CVD), in which said solid particles are deposited on a substrate heated to a temperature between 450° and 1200° C. at a pressure between $10^{-5}$ and 1 bar and in a directed flow in a reactor of said reactant gas characterized in that said directed flow of said reactant gas is completely passed through a porous non-reactive intermediate body having a thickness of between 2 and 3 mm of a material suitable for use at temperatures up to 2500° C., which intermediate body is present in the zone having the maximum energy content within said reactor, whereby said reactant gas is excited in said intermediate body to form said solid particles, whereafter said solid particles are deposited on the substrate.

2. A method as claimed in claim 1, wherein loose powders which are present on a gas-permeable support or powders which are compressed to a moulded body are used as said intermediate body.

3. A method as claimed in claim 1, wherein a porous solid body having through-pores with a size ranging between 1 and 100 μm is used as said intermediate body.

4. A method as claimed in claim 1 wherein the energy required for the deposition process is coupled into the intermediate body as microwave energy.

5. A method as claimed in claim 1 wherein the energy required for the deposition process is coupled into the intermediate body as high-frequency energy.

6. A method as claimed in claim 1 wherein the energy required for the deposition process is coupled into the intermediate body by means of a direct current flow through said body.

7. A method as claimed in claim 3, wherein said intermediate body is made of porous sintered metals.

8. A method as claimed in claim 3, wherein said intermediate body is made of porous ceramic material.

9. A method as claimed in claim 3, wherein said intermediate body is made of porous carbon.

10. A method as claimed in claim 3, wherein the energy required for the deposition process is coupled into the intermediate body as microwave energy.

11. A method as claimed in claim 3, wherein the energy required for the deposition process is coupled into the intermediate body as high-frequency energy.

12. A method as claimed in claim 3, wherein the energy required for the deposition process is coupled into the intermediate body by means of a direct current flow through said body.

13. A method of claim 3 wherein said intermediate body is formed of foamed carbon.

14. A method of claim 3 wherein said intermediate body is formed of graphite felt.

* * * * *